United States Patent [19]

Uno

[11] Patent Number: 5,374,837
[45] Date of Patent: Dec. 20, 1994

[54] THIN FILM TRANSISTOR ARRAY SUBSTRATE ACTING AS AN ACTIVE MATRIX SUBSTRATE

[75] Inventor: Mitsuhiro Uno, Osaka, Japan

[73] Assignee: Matsushita Electric Industrial Co., Ltd., Osaka, Japan

[21] Appl. No.: 231,582

[22] Filed: Apr. 20, 1994

Related U.S. Application Data

[63] Continuation of Ser. No. 978,641, Nov. 19, 1992, abandoned.

[30] Foreign Application Priority Data

Nov. 25, 1991 [JP] Japan .................. 3-308152

[51] Int. Cl.$^5$ .................. H01L 27/01; H01L 27/13; H01L 29/78
[52] U.S. Cl. .................. 257/350; 257/57; 257/66; 257/352; 257/741; 257/746; 257/774
[58] Field of Search .................. 257/57, 66, 347, 349, 257/350, 352, 390, 401, 741, 744, 746, 774; 359/87, 88, 79

[56] References Cited

U.S. PATENT DOCUMENTS 5,066,106 11/1991 Sakamoto et al. .................. 359/87
5,068,748 11/1991 Ukai et al. .................. 359/87
5,153,754 10/1992 Whetlan .................. 359/87

FOREIGN PATENT DOCUMENTS 2245736 10/1990 Japan .
3-58019 3/1991 Japan .

Primary Examiner—Ngan V. Ngo
Attorney, Agent, or Firm—Ratner & Prestia

[57] ABSTRACT

An active matrix substrate in which signals are inputted by a drive IC to a plurality of gate wirings made of aluminum or the like so as to drive a plurality of pixel electrodes such that an image is formed, said active matrix substrate comprising: a drive IC mounting portion which is formed together with the pixel electrodes on a principal face of a substrate by an indium-tin-oxide (ITO) film identical with that forming the pixel electrodes; wherein the gate wirings are disposed on the ITO film of the drive IC mounting portion so as to be directly connected to the ITO film.

3 Claims, 5 Drawing Sheets

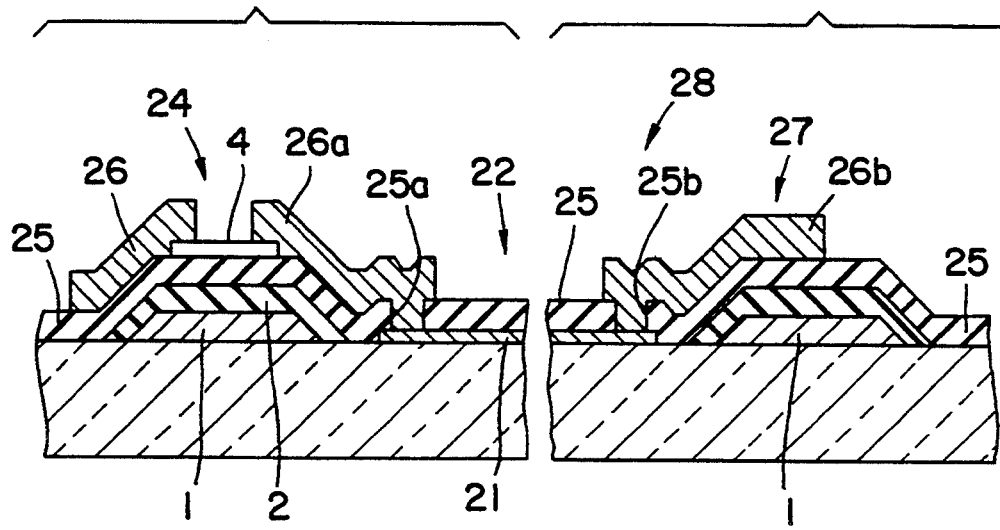

THIN FILM TRANSISTOR ARRAY SUBSTRATE ACTING AS AN ACTIVE MATRIX SUBSTRATE

This application is a continuation of application Ser. No. 07/978,641 filed Nov. 19, 1992 now abandoned.

BACKGROUND OF THE INVENTION

The present invention relates to a thin film transistor (TFT) array substrate which constitutes a display unit in combination with, for example, liquid crystal.

In recent years, as a display unit for a work station, there is strong demand for a liquid crystal display employing the TFT array substrate, which is larger in size and has larger capacity. Thus, the TFT array substrate is also required to have larger area and larger capacity. In case a gate wiring made of Cr or Ta employed in the known small TFT array substrate is used in a TFT array substrate having a large area, resistance of the gate wiring becomes extremely large, so that a gate pulse signal inputted from a drive IC is attenuated at a terminal of the gate wiring and thus, uniform display performance cannot be obtained in the liquid crystal display. Therefore, in the TFT array substrate having a large area and a large capacity, aluminum (Al) having a low resistance has been generally used as material for the gate wiring.

Meanwhile, much attention is recently focused on a gate insulating film obtained by anodic oxidation of metals such as Al, Ta, Ta-Mo alloy, etc. forming the gate wiring. The insulating film formed by anodic oxidation has such a feature that an insulating film having less defects can be produced more easily than those produced by conventional chemical vapor deposition (CVD), sputtering, etc.

FIGS. 1 and 2 show a known TFT array substrate employing the gate insulating film formed by anodic oxidation and acting as an active matrix substrate. In the known TFT array substrate, FIGS. 1(a), 1(b) and 2(a) show a TFT, a pixel electrode 6 and an auxiliary capacity portion 7 for holding a signal supplied to the pixel electrode 6, while FIGS. 1(c) and 2(b) show a drive IC mounting portion 8 provided at an end of a gate wiring 1. In order to produce the known TFT array substrate of FIGS. 1 and 2, the gate wiring 1 is initially formed on a substrate by anodic oxidation using one of metals such as Al, Ta, Ta-Mo alloy, etc. Subsequently, a pattern of an organic film such as a resist is formed at an area which is not subjected to anodic oxidation. In this state, the substrate is dipped in electrolyte such as oxalic acid such that the short-circuited pixel electrode 6 and an electrode of Pt are connected to an anode and a cathode, respectively. Thereafter, electrolysis is performed by applying a voltage of about 100V to the substrate so as to generate oxygen such that the wiring metal is oxidized. As a result, an anodic oxidation film 2 is formed on the gate wiring 1 except for the resist pattern. Subsequently, the resist pattern is removed and a silicon nitride film 3 is formed by CVD. Thereafter, an i-type semiconductor film 4 constituting the TFT is formed at proper locations on the silicon nitride film 3 which is formed on the gate electrode 1 and the anodic oxidation film 2.

Then, the auxiliary capacity portion 7 is formed between the pixel electrode 6 and the gate wiring 1 by an indium-tin-oxide (ITO) film 5 which is a transparent and electrically conductive film. At this time, the drive IC mounting portion 8 for supplying a gate pulse signal from the drive IC to the gate wiring 1 is also formed by the ITO film 5 simultaneously. The drive IC mounting portion 8 is formed by the ITO film 5 on the ground that since the ITO film 5 has more stable surface state than other electrically conductive films, excellent connection between the drive IC mounting portion 8 and and the drive IC can be obtained. Furthermore, a source drain electrode 9 is formed in a shape of matrix relative to the gate wiring 1 and is connected to the pixel electrode 6 through the TFT 4 and a pattern 9a.

Meanwhile, the drive IC mounting portion 8 is disposed at the end of the gate wiring 1. In the drive IC mounting portion 8, if the ITO film 5 is connected to the gate wiring 1 via a contact hole 3a formed in the silicon nitride film 3, material of the gate wiring 1 is oxidized at the time of formation of the ITO film 5. As a result, resistance of contact between the ITO film 5 and the gate wiring 1 is increased and thus, such a problem arises that a high-frequency signal inputted from the drive IC is distorted. In order to solve this problem, such a countermeasure has been employed in which a Cr pattern 11 is formed under the gate wiring 1 so as to be partially connected to the gate wiring 1 and the ITO film 5 is connected to the silicon nitride film 3 on the Cr pattern 11 through the contact hole 3a. In this countermeasure, since the gate wiring 1 is connected to the ITO film 5 by way of the Cr pattern 11, excellent connection therebetween is obtained.

The known TFT array substrate of the above described arrangement has the following drawbacks. Firstly, in order to obtain excellent contact between the gate wiring 1 and the ITO film 5, a pattern of another metal such as Cr is required to be provided. Hence, additional processes of forming and patterning the Cr film should be performed, so that production processes for the TFT array substrate are increased in number, thereby resulting in rise of its production cost. Secondly, in the case where the gate wiring is made of aluminum (Al), so-called "hillock", i.e. local projective crystal growth occurs in the Al pattern during a heat treatment process in photolithography. If this hillock becomes so large as not to be covered by the silicon nitride film 3, etchant such as aqueous solution of hydrogen chloride or aqueous solution of ferric chloride and hydrogen chloride penetrates into the gate wiring 1 through the hillock so as to dissolve Al, thereby resulting in disconnection of the gate wiring 1.

SUMMARY OF THE INVENTION

Accordingly, an essential object of the present invention is to provide a TFT array substrate which eliminates inconveniences inherent in conventional TFT array substrates.

In order to accomplish this object of the present invention, a pattern of an ITO film is formed prior to a process of forming a gate wiring. Meanwhile, a portion of an IC mounting portion formed by the ITO film is provided under the gate wiring so as to be directly connected to the gate wiring. In the present invention, since etching of the ITO film is performed prior to formation of the gate wiring, such a phenomenon does not take place that even if the gate wiring is made of aluminum, the gate wiring is not eroded by etchant such as aqueous solution of hydrogen chloride or aqueous solution of ferric chloride and hydrogen chloride. As a result, such an effect can be achieved that disconnection of the gate wiring is lessened.

Furthermore, in the IC mounting portion employing the ITO film, since excellent connection between the gate wiring and the ITO film can be obtained without the need for using another metal such as Cr, production processes of the TFT array substrate can be reduced in number, thus resulting in drop of its production cost.

BRIEF DESCRIPTION OF THE DRAWINGS

This object and features of the present invention will become apparent from the following description taken in conjunction with the preferred embodiments thereof with reference to the accompanying drawings, in which:

FIG. 3(a) is a sectional view showing one portion of a TFT array substrate acting as an active matrix substrate, according to a first embodiment of the present invention;

FIG. 3(b) is a sectional view showing another portion of a TFT array substrate acting as an active matrix substrate, according to the first embodiment of the present invention.

FIG. 3(c) is a sectional view showing another portion of the TFT array substrate of FIGS. 3(a) and 3(b);

Before the description of the present invention proceeds, it is to be noted that like parts are designated by like reference numerals throughout several views of the accompanying drawings.

DETAILED DESCRIPTION OF THE INVENTION

Figures 1A, 1B, 1C:
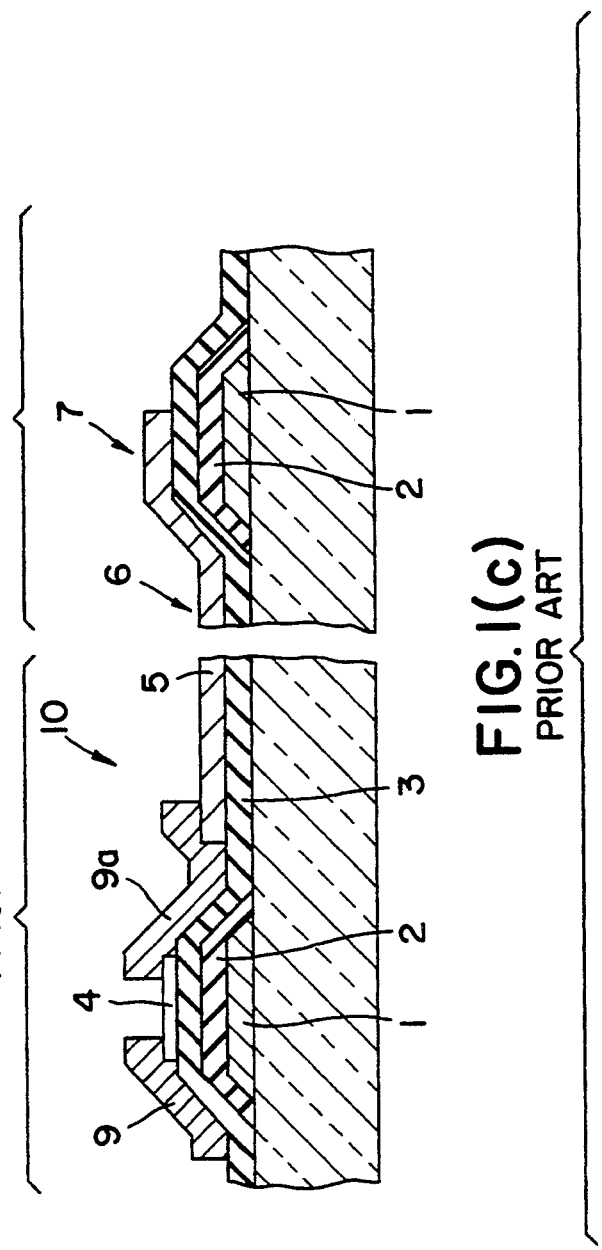
FIG. 1(a) is a sectional view showing one portion of a prior art TFT array substrate acting as an active matrix substrate (already referred to)
FIG. 1(b) is a sectional view showing another portion of a prior art TFT array substrate acting as an active matrix substrate (already referred to)
FIG. 1(c) is a sectional view showing another portion of the prior art TFT array substrate of FIGS. 1(a) and 1(b) (already referred to)
Figure 2A:
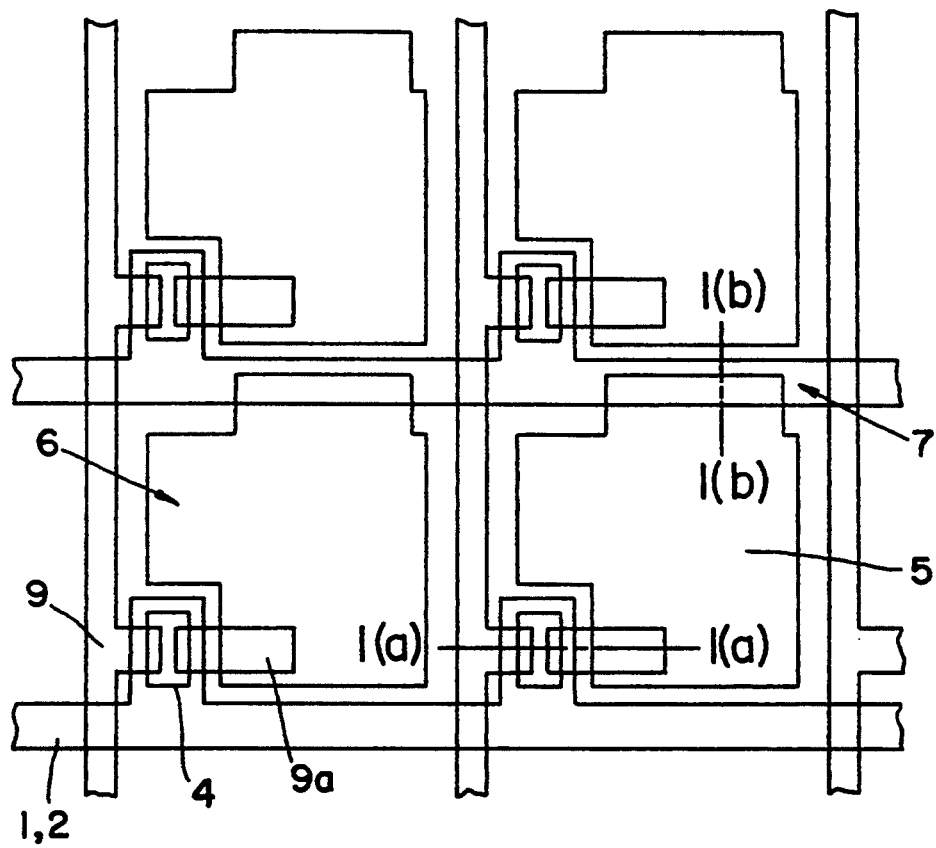
FIGS. 2(a) and 2(b) are top plan views of FIGS. 1(a) and 1(b), respectively (already referred to)
Figure 2B:
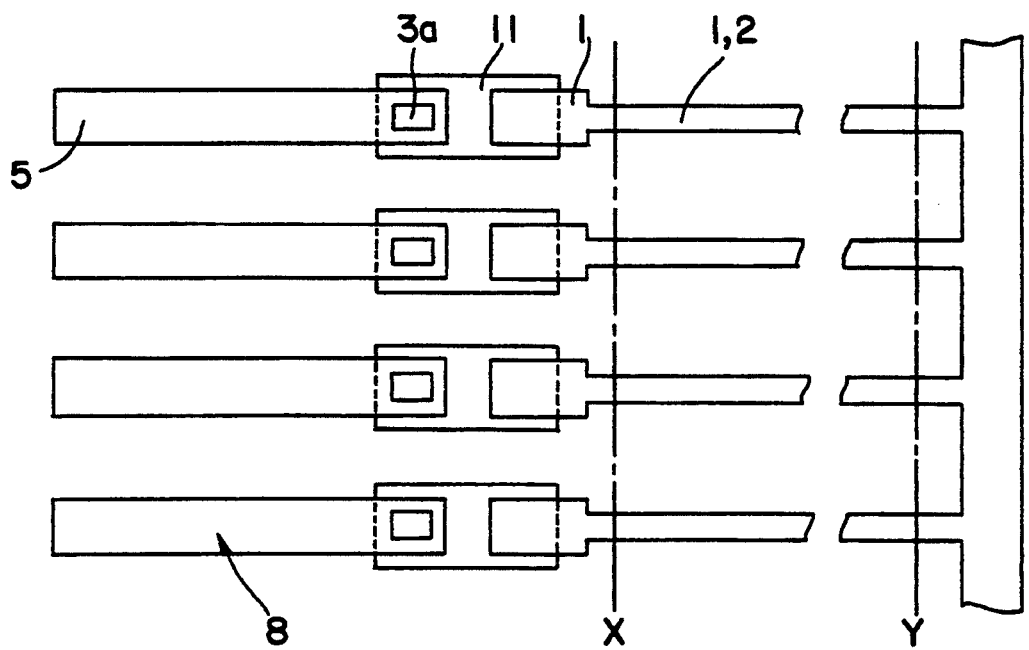
Figure 4A:
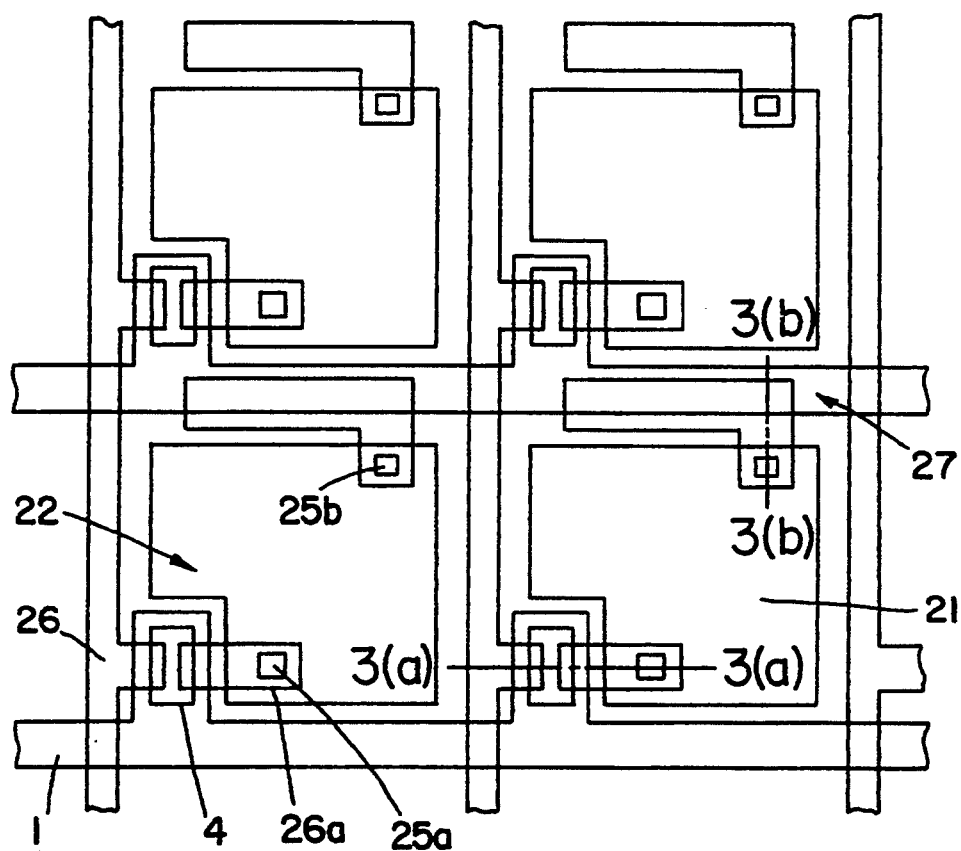
FIGS. 4(a) and 4(b) are top plan views of FIG. 3(a) and 3(b), respectively.
Figure 4B:
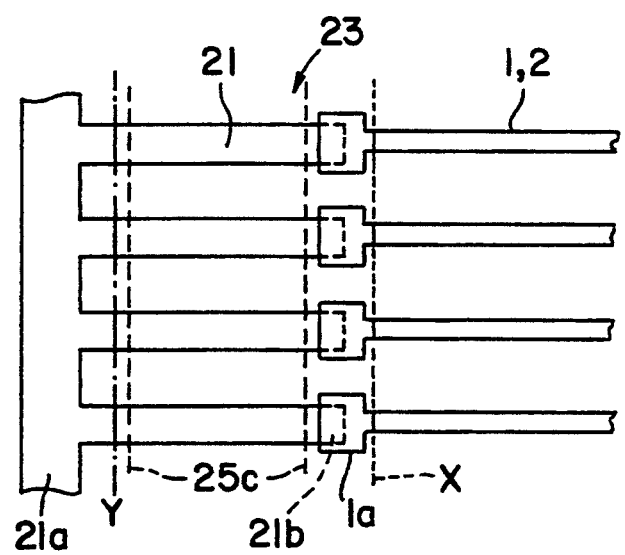

Referring now to the drawings, there is shown in FIGS. 3 and 4, a TFT array substrate 28 acting as an active matrix substrate (i.e. a switching device array substrate), according to a first embodiment of the present invention. FIGS. 3(a), 3(b) and 4(a) show a TFT 24, a pixel electrode 22 and an auxiliary capacity portion 27 in the TFT array substrate 28, while FIGS. 3(b) and 4(b) show a drive IC mounting portion 23 in the TFT array substrate 28.

The TFT array substrate 28 of FIGS. 3 and 4 produced as follows. Initially, the pixel electrode 22 and the drive IC mounting portion 23 are formed on one principal face of a glass substrate by an ITO film 21. Etching of the ITO film 21 is performed by using aqueous solution of hydrogen chloride or aqueous solution of ferric chloride and hydrogen chloride. At this time, in a whole pattern of the drive IC mounting portion 23, the ITO film 21 has a short circuit portion 21a for short-circuiting the ITO film 21 such that a voltage is simultaneously applied to a whole of a gate wiring 1 in an anodic oxidation process. Subsequently, the gate wiring 1 is formed by aluminum (Al) such that in the drive IC mounting portion 23, one end portion 1a of the gate wiring 1 overlaps one end portion 21b of a pattern of the ITO film 21. Thereafter, in a region disposed leftwards from the dotted line X in FIG. 4(b), the ITO film 21 and the one end portion 1a of the gate wiring 1 are coated by a pattern of an organic film such as a resist such that electrolyte is prevented from eroding the ITO film 21 in the anodic oxidation process. Meanwhile, in the TFT 24, if two metals of the gate wiring 1 and the ITO film 21 are held in contact with each other and are simultaneously exposed to electrolyte, the ITO film 21 will be dissolved through supply of electric charge. However, in this case, since the pixel electrode 22 formed by the ITO film 21 is not connected to the gate wiring 1, the pixel electrode 22 is not eroded by electrolyte.

Then, the substrate is dipped in electrolyte such as oxalic acid and the short-circuited gate wiring 1 and an electrode of Pt are connected to an anode and a cathode, respectively. Thereafter, electrolysis is performed by applying a voltage of about 100V to the substrate so as to generate oxygen such that an anodic oxidation film 2 is formed on the gate wiring 1 except for the resist pattern. At this time, formation current is supplied from the pattern of the ITO film 21 of the short-circuited drive IC mounting portion 23 to the gate wiring 1. Subsequently, the resist pattern is removed and a silicon nitride film 25 is formed by CVD. Then, an i-type semiconductor film 4 constituting the TFT 24 is formed.

Furthermore, contact holes 25a and 25b are formed on the silicon nitride film 25 on the ITO film 21 at the pixel electrode 22, while a contact hole 25c is formed on the silicon nitride film 25 on the ITO film 21 at the drive IC mounting portion 23. Finally, a source drain electrode 26 made of aluminum (Al) is formed in a shape of matrix such that the source drain electrode 26, the pixel electrode 22 and the i-type semiconductor film 4 constituting the TFT 24 are connected to each other through the contact hole 25a. At this time, a pattern 26b made of the same metal as that of the source drain electrode 26 is simultaneously formed on the gate wiring 1 at a preceding stage of its pattern so as to be connected to the pixel electrode 22 through the contact hole 25b. As a result, the auxiliary capacity portion 27 is formed. By the above mentioned processes, the TFT array substrate 28 is produced. After the TFT array substrate 28 has been produced as described above, a group of the gate wirings 1 short-circuited by the ITO film 21 are separated from each other by cutting the substrate along the cutting line Y shown in FIG. 4(b).

In this embodiment, etching for forming the pattern of the ITO film 21 is performed prior to the process of forming the gate wiring 1. Therefore, aluminum of the gate wiring 1 is not eroded by the etchant for the ITO film 21 and thus, disconnection of the gate wiring 1 is reduced.

Furthermore, in the drive IC mounting portion 23 employing the ITO film 21, since excellent connection between the gate wiring 1 and the ITO film 21 can be obtained without the need for using another metal such as Cr in contrast with known TFT array substrates, the production processes of the TFT array substrate are reduced in number, thereby resulting in drop of its production cost.

Figure 5A:
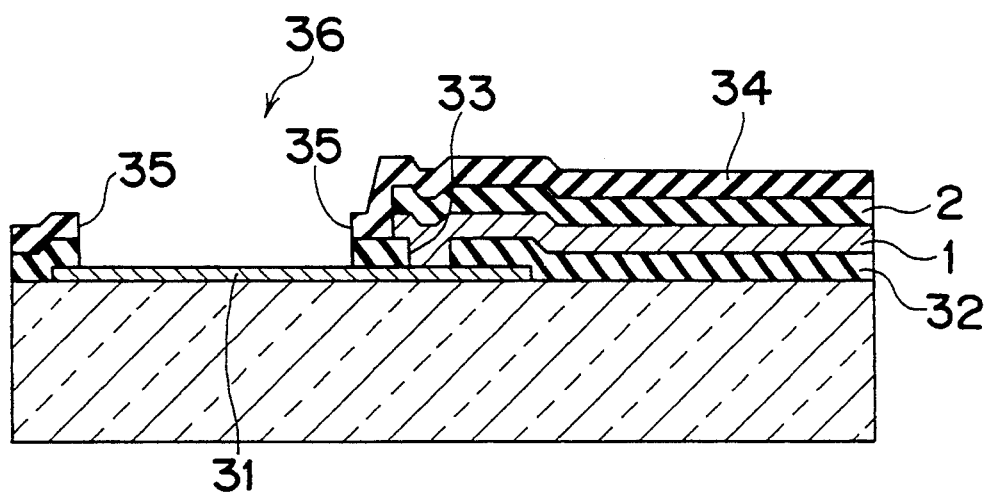
FIG. 5(a) is a sectional view showing a portion of a TFT array substrate acting as an active matrix substrate, according to a second embodiment of the present invention.
Figure 5B:
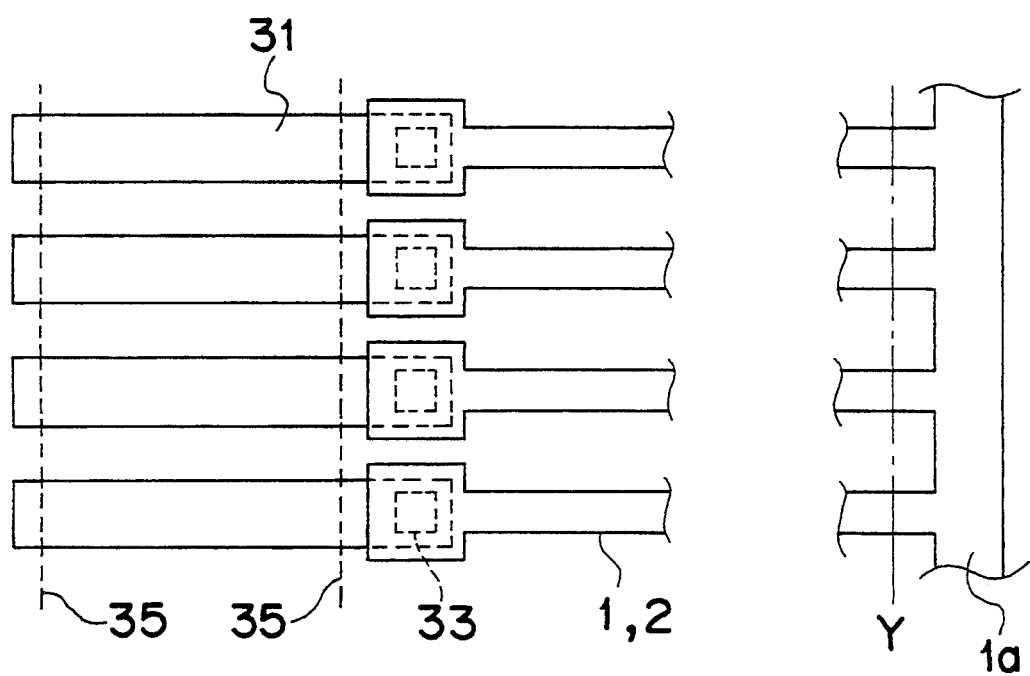
FIG. 5(b) is a top plan view of FIG. 5(a).

FIGS. 5(a) and 5(b) show a drive IC mounting portion 36 of a TFT array substrate according to a second embodiment of the present invention. The arrangement of the TFT, the pixel electrode and the auxiliary capacity portion in FIG. 5 is substantially identical with that of the TFT array substrate 28 of FIGS. 3 and 4.

The TFT array substrate of FIG. 5 is produced as follows. Initially, the drive IC mounting portion 36 is formed on a principal face of a glass substrate by an ITO film 31. Etching for forming a pattern of the ITO film 31 is performed by using aqueous solution of hydrogen chloride or aqueous solution of ferric chloride and hydrogen chloride. At this time, in order to simultaneously apply a voltage to a whole of the gate wiring 1 in an anodic oxidation process, a short circuit portion 1a is formed at one end portion of the gate wiring 1 remote from the drive IC mounting portion 36.

Subsequently, a silicon dioxide film 32 is deposited and a contact hole 33 is formed on the silicon dioxide film 32 on the pattern of the ITO film 31. Then, the gate wiring 1 is formed by aluminum such that one end portion of the gate wiring 1 is connected to the pattern of the ITO film 31 through the contact hole 33. If two kinds of metals of the gate wiring 1 and the ITO film 31 are connected to each other and are simultaneously subjected to electrolyte, the ITO film 31 will be dissolved through supply of electric charge. However, in this case, since the pattern of the ITO film 31 is covered by the silicon dioxide film 32, the ITO film 31 is not exposed to electrolyte and thus, is not eroded in the anodic oxidation process. Hence, in this state, the substrate is dipped in electrolyte such as oxalic acid such that the short-circuited gate wiring 1 and the an electrode of Pt are, respectively, connected to an anode and a cathode. Thereafter, electrolysis is performed by applying a voltage of about 100V to the substrate so as to generate oxygen such that an anodic oxidation film 2 is formed. At this time, formation current is supplied from one end 1a of the short-circuited gate wiring 1 to the gate wiring 1.

Furthermore, after a silicon nitride film 34 has been deposited, a contact hole 35 is formed on the silicon nitride film 34 so as to expose the ITO film 31 for mounting the drive IC. Then, the subsequent processes are performed in the same manner as in the first embodiment of the present invention. In the subsequent processes, production of the TFT array substrate is completed and a group of the gate wirings 1 are separated from each other by cutting the substrate along the cutting line Y of FIG. 5(b).

In the second embodiment of the present invention, since etching for forming the pattern of the ITO film 31 is performed prior to the process of forming the gate wiring 1 in the same manner as in the first embodiment, aluminum of the gate wiring 1 is not eroded by etchant for the ITO film 31 and thus, disconnection of the gate wiring 1 is lessened.

Meanwhile, in the first embodiment, the ITO film and the one end portion of the gate wiring are coated by the organic pattern film such as the resist such that the ITO film is not exposed to electrolyte in the anodic oxidation process. The pattern of the organic film such as the resist is readily peeled from the substrate especially when subjected to a high voltage in the anodic oxidation process, thereby resulting in malfunctioning of the TFT array substrate. However, in the second embodiment of the present invention, since it is not necessary to provide the pattern of the organic film, the above mentioned problem can be avoided.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A switching device array substrate in which signals which are transmitted by a driving device are transferred through a plurality of aluminum gate wirings so as to drive a plurality of pixel electrodes to form an image, said switching device array substrate comprising:

a driving device mounting portion formed on a principal face of a substrate by an indium-tin-oxide (ITO) film identical with that forming the plurality of pixel electrodes;

wherein the aluminum gate wirings are disposed on the ITO film of the driving device mounting portion so as to be directly connected to the ITO film.

2. An active matrix substrate as claimed in claim 1, wherein the gate wirings are deposited on the ITO film so as to overlap the ITO film such that a portion of the gate wirings is brought into direct contact with a portion of the ITO film.

3. An active matrix substrate as claimed in claim 1, further comprising:

an insulating film which is deposited on the ITO film so as to overlap the ITO film and has a contact hole leading to the ITO film;

wherein the gate wirings are deposited on the insulating film such that a portion of the gate wirings is brought into direct contact with a portion of the ITO film through the contact hole of the insulating film.

* * * * *